(12) United States Patent
Asai et al.

(10) Patent No.: US 7,147,510 B2
(45) Date of Patent: Dec. 12, 2006

(54) SOCKET FOR INSTALLING ELECTRONIC PARTS

(75) Inventors: Kiyoshi Asai, Tokyo (JP); Kazuaki Kanazawa, Tokyo (JP); Junichi Kobayashi, Tokyo (JP)

(73) Assignee: SMK Corporation, Tokyo (JP)

( * ) Notice: Subject to any disclaimer, the term of this patent is extended or adjusted under 35 U.S.C. 154(b) by 0 days.

(21) Appl. No.: 10/925,540

(22) Filed: Aug. 23, 2004

(65) Prior Publication Data

US 2005/0215117 A1   Sep. 29, 2005

(30) Foreign Application Priority Data

Mar. 25, 2004   (JP)   ............... 2004-088396

(51) Int. Cl.
*H01R 13/648* (2006.01)
(52) U.S. Cl. ..................................... 439/607
(58) Field of Classification Search ........ 439/607–610, 439/939, 63, 70, 79, 571, 637
See application file for complete search history.

(56) References Cited

U.S. PATENT DOCUMENTS 6,280,208 B1 * 8/2001 Masuda et al. ............... 439/98
6,296,492 B1 * 10/2001 Fujimoto et al. ............. 439/63
6,595,801 B1 * 7/2003 Leonard et al. ............. 439/607
6,796,838 B1 * 9/2004 Yoshioka .................... 439/607
6,816,376 B1 * 11/2004 Bright et al. ................ 361/704

FOREIGN PATENT DOCUMENTS

JP   2004-032081   1/2004

OTHER PUBLICATIONS

Patent Abstracts of Japan for 2004-32081 published on Jan. 29, 2004.

* cited by examiner

*Primary Examiner*—J. F. Duverne
(74) *Attorney, Agent, or Firm*—Darby & Darby

(57) ABSTRACT

An electronic parts installing socket capable of downsizing an electronic device by reducing the height of socket projecting from one surface of the printed circuit board comprises a socket housing fitted into a socket inserting hole. The socket inserting hole penetrates from a front surface to a rear surface of a printed circuit board. Also, a plurality of contacts each having contact pieces disposal on the socket housing and project from a side surface of the socket housing. The contact pieces are connected a contact connecting pattern which is positioned at an opening edge portion of socket inserting hole. Front surface shielding members and are connected to the printed circuit board to shield a portion projecting to the front surface of the printed circuit board. A box shaped rear surface shielding member covers a portion projecting from a rear surface of the printed circuit board to the socket housing and is connected to the front surface shielding members.

2 Claims, 9 Drawing Sheets

SOCKET FOR INSTALLING ELECTRONIC PARTS

The present application claims priority under 35 U.S.C. §119 to Japanese Patent Application No. 2004-088396 filed on Mar. 25, 2004. The content of the application is incorporated herein by reference in its entirety.

BACKGROUND OF THE INVENTION

The present invention relates to an electronic parts installing socket for installing electronic parts such as a camera module on a printed circuit board.

Conventionally, an electronic device such as a mobile phone has a printed circuit board in the electronic device. Electronic parts such as a camera module or semiconductor elements are installed on a front surface and a rear surface of the printed circuit board. Heat-sensitive electronic parts are connected to the printed circuit board using an electronic parts installing socket, because it is difficult to install the heat-sensitive electronic parts on the printed circuit board with a soldered connection.

In case of installing the electronic parts on the printed circuit board using the electronic parts installing socket, the height of electronic parts installing socket is added to the height of the electronic part taken from one surface of either the front and/or the rear surfaces. As a result, it is necessary to allocate space corresponding to the heights of the electronic parts and the electronic parts installing socket, in a device housing. This makes it difficult to downsize the electronic device.

Under the circumstances, an opening is formed which penetrates the printed circuit board from the front surface to the rear surface, in order to form a socket inserting hole. The electronic parts installing socket is inserted into the socket inserting hole. A part of socket projects from the rear surface of the printed circuit board. The height of socket is decreased that projects from the front surface or the rear surface of the printed circuit board, in order to downsize the electronic device. An example of this is disclosed in Japanese Laid-Open Patent publication Tokkai 2004-32081

However, the above-mentioned prior art has a structure in which a contact piece projects from a side surface of a socket housing towards an outside. In order to shield the contact piece, it is necessary to enlarge the outside shape of shielding case so as to locate a surrounding wall of the shielding case to an outside of a contact piece end. As a result, it is difficult to shrink the electronic device.

In addition, it is difficult to shield a portion which projects from the socket inserting hole of the electronic parts installing socket to the rear surface of the printed circuit board, in the shielding case in which the surrounding wall of the shielding case is located to the outside of the contact piece end.

SUMMARY OF THE INVENTION

In order to resolve the above-mentioned problems of the prior art, it is an object of the present invention to provide an electronic parts installing socket capable of carrying out satisfactory shielding and capable of downsizing an electronic device by reducing the height of the socket projecting from one surface of the printed circuit board and using spaces of the front and the rear surfaces of the printed circuit board.

In order to accomplish the above-mentioned object, according to a first aspect of the present invention, there is provided an electronic parts installing socket having a socket housing fitted into a socket inserting hole that penetrates from a front surface to a rear surface of a printed circuit board and a plurality of contacts each of which has contact pieces which are held on the socket housing and project from a side surface of the socket housing. The contact pieces form a contact connecting pattern which is positioned at an opening edge portion of the socket inserting hole. The electronic parts installing socket further has a front surface shielding member for shielding a board front surface of the socket housing. The front surface shielding member has a plurality of shielding pieces which are positioned like the teeth of a comb so as to sandwich the contact pieces of the contacts and which are connected to a shield connecting pattern formed on the opening edge portion of the socket inserting hole. An electronic part held on the socket housing is connected to the printed circuit board through the contacts.

Inasmuch as the electronic parts installing socket according to the first aspect of the present invention comprises a socket housing which is fitted into a socket inserting hole penetrateing from a front surface to a rear surface of a printed circuit board and a plurality of contacts each of which has contact pieces which are held on the socket housing and project from a side surface of the socket housing. The contact pieces are connected in a contact connecting pattern which is positioned at an opening edge portion of the socket inserting hole. Thus, it is possible to reduce the height which projects to one of surfaces of the printed circuit board. As a result, it is possible to downsize the electronic device.

In addition, inasmuch as the electronic parts installing socket according to the first aspect of the present invention further includes a front surface shielding member for shielding a board front surface of the socket housing and the front surface shielding member having a plurality of shielding pieces which are positioned similar to the teeth of a comb so as to layer the contact pieces of the contacts and which are connected to a shield connecting pattern formed on the opening edge portion of the socket inserting hole. Thus, it is possible to obtain a sufficient shielding effect for the contact pieces and to downsize the electronic device even if surrounding walls of a shielding case are not located at an outside end of the contact pieces.

According to a second aspect of the present invention, the electronic parts installing socket further includes a rear surface shielding member formed in a box shape covering a portion projecting from a rear surface of the printed circuit board to the socket housing. The rear surface shielding member has a plurality of connecting pieces which are arranged similar to the teeth of a comb on an upper edge of the rear surface shielding member. The rear surface shielding member is attached to a rear surface portion of the socket housing. The connecting pieces are connected to the front surface shielding member through the socket inserting hole and the contact pieces of the contacts project outward from gaps between the connecting pieces.

As described above, the electronic parts installing socket according to the second aspect of the present invention further has a rear surface shielding member formed in a box shape covering a portion projecting from a rear surface of the printed circuit board to the socket housing. The rear surface shielding member has a plurality of connecting pieces which are arranged similar to the teeth of a comb on an upper edge of the rear surface shielding member and the rear surface shielding member is attached to a rear surface portion of the socket housing. The connecting pieces are connected to the front surface shielding member through the socket inserting hole and the contact pieces of the contacts project outward from gaps between the connecting pieces. As a result, it is possible to sufficiently shield the portion projecting to the rear surface of the printed circuit board together with a portion projecting to the front surface of the printed circuit board. In addition, it is possible to obtain a high shielding efficiency, as the front surface shielding member is connected to the rear surface shielding member.

PREFERRED EMBODIMENTS OF THE INVENTION

Figure 1:
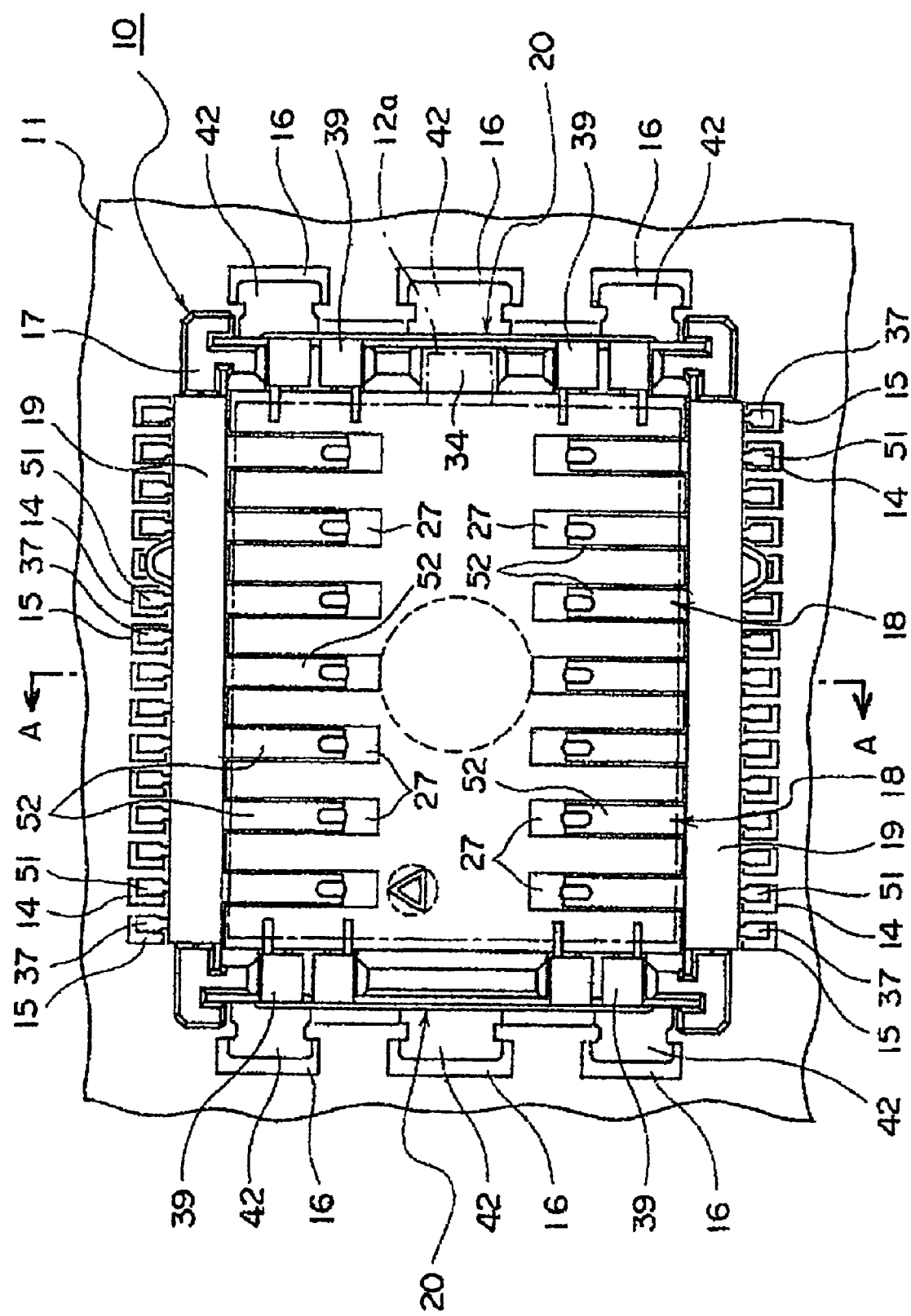
FIG. 1 shows a sectional view for illustrating a using state of an electronic parts installing socket according to the present invention.
Figure 2:
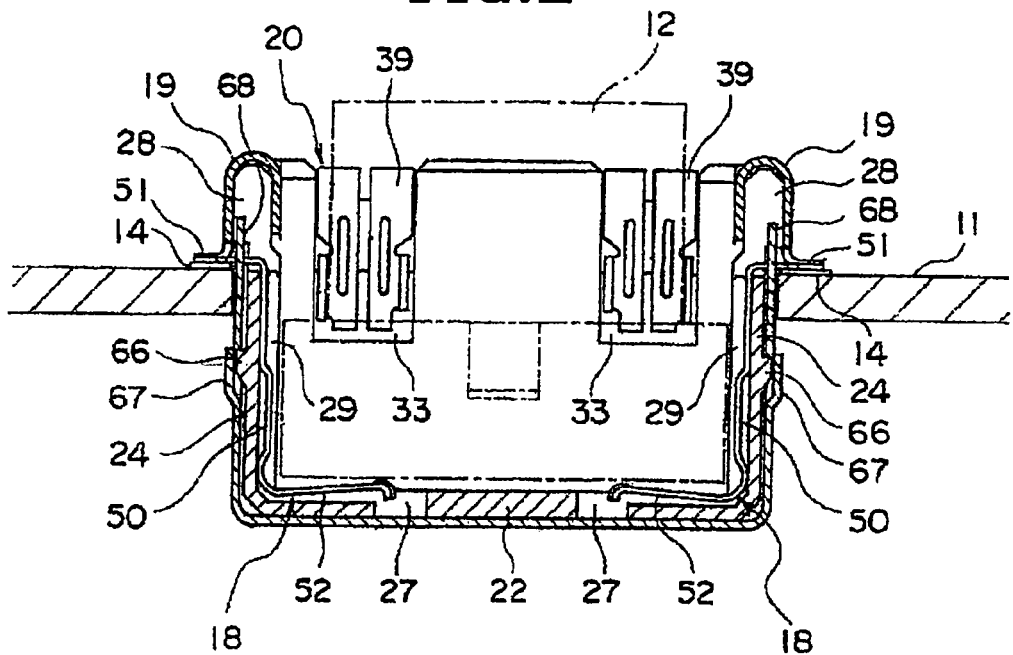
FIG. 2 shows a sectional view along A-A line of FIG. 1.

Description will be made as regards an electronic parts installing socket according to the present invention with reference to FIGS. 1 to 14. FIGS. 1 and 2 illustrate an embodiment in which a camera module is installed on a printed circuit board, using the electronic parts installing socket according to the present invention. The camera module is an example of one of a plurality of electronic parts. FIGS. 1 and 2 illustrate an electronic parts installing socket, a printed circuit board, and a camera module 12 which is one of a plurality of electronic parts.

Figure 3:
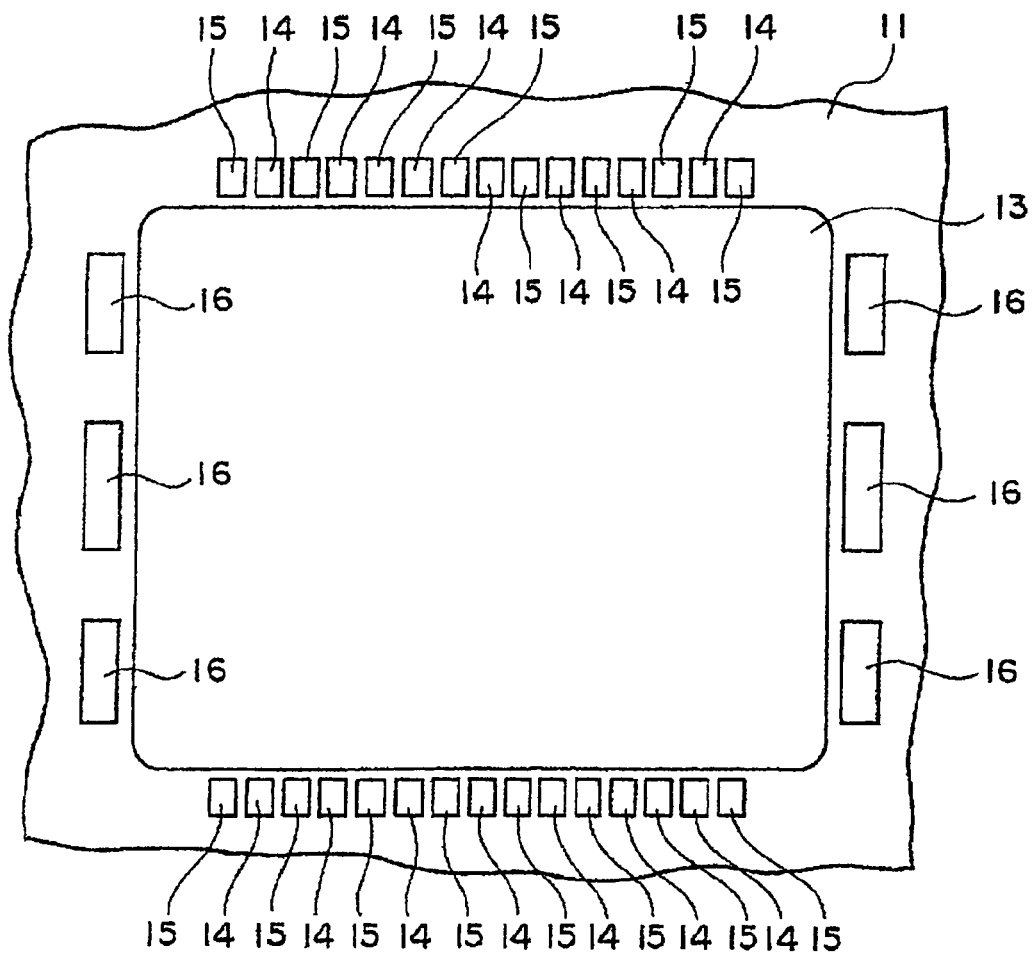
FIG. 3 shows a plane view for illustrating a printed circuit board of FIG. 1.
Figure 4:
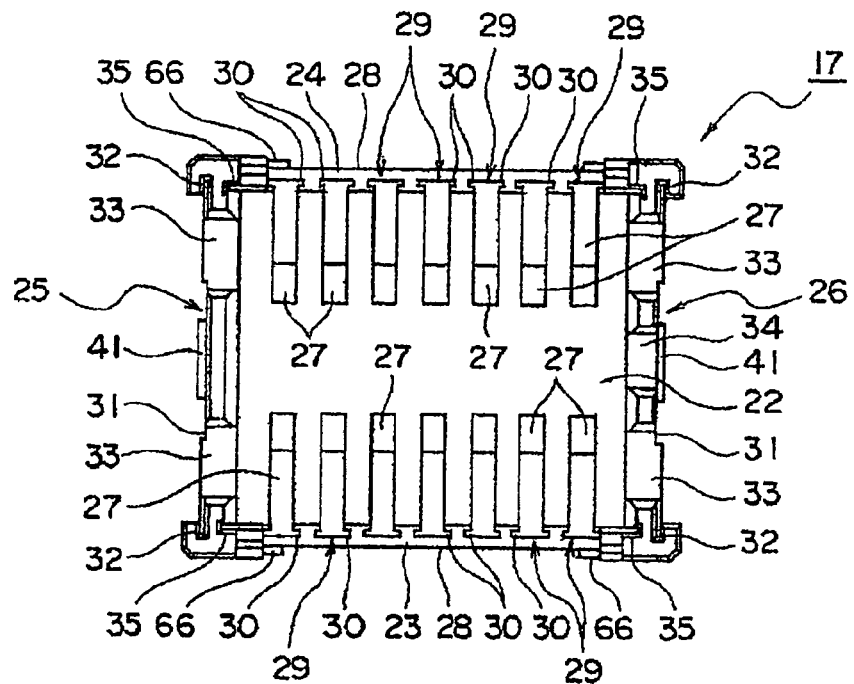
FIG. 4 shows a plane view for illustrating a socket housing of FIG. 1.
Figure 5:
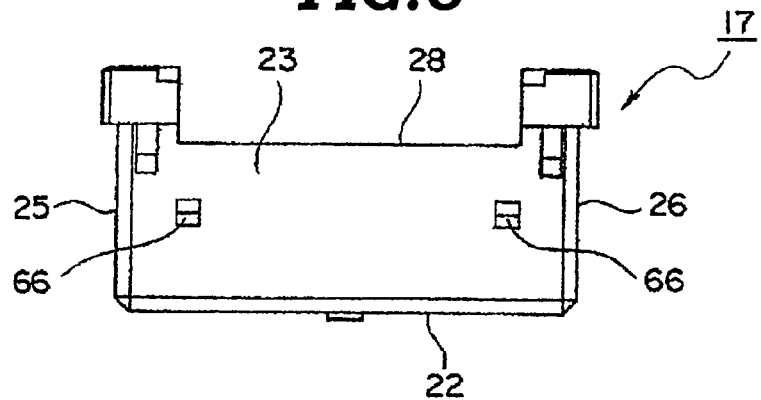
FIG. 5 shows a front view for illustrating the socket housing of FIG. 1.
Figure 6:
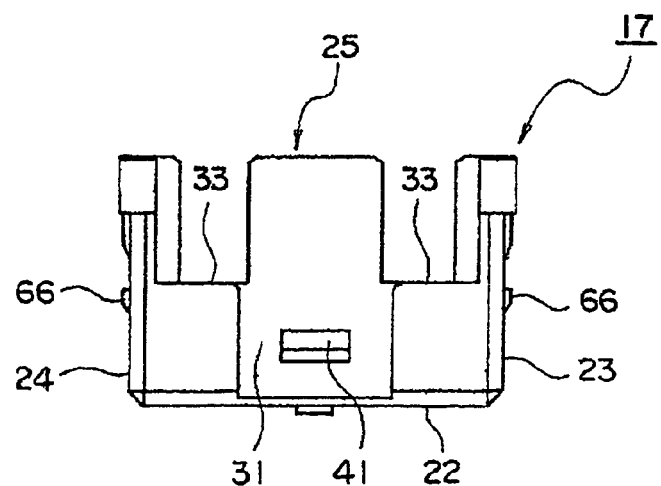
FIG. 6 shows a bottom view for illustrating the socket housing of FIG. 1.
Figure 7:
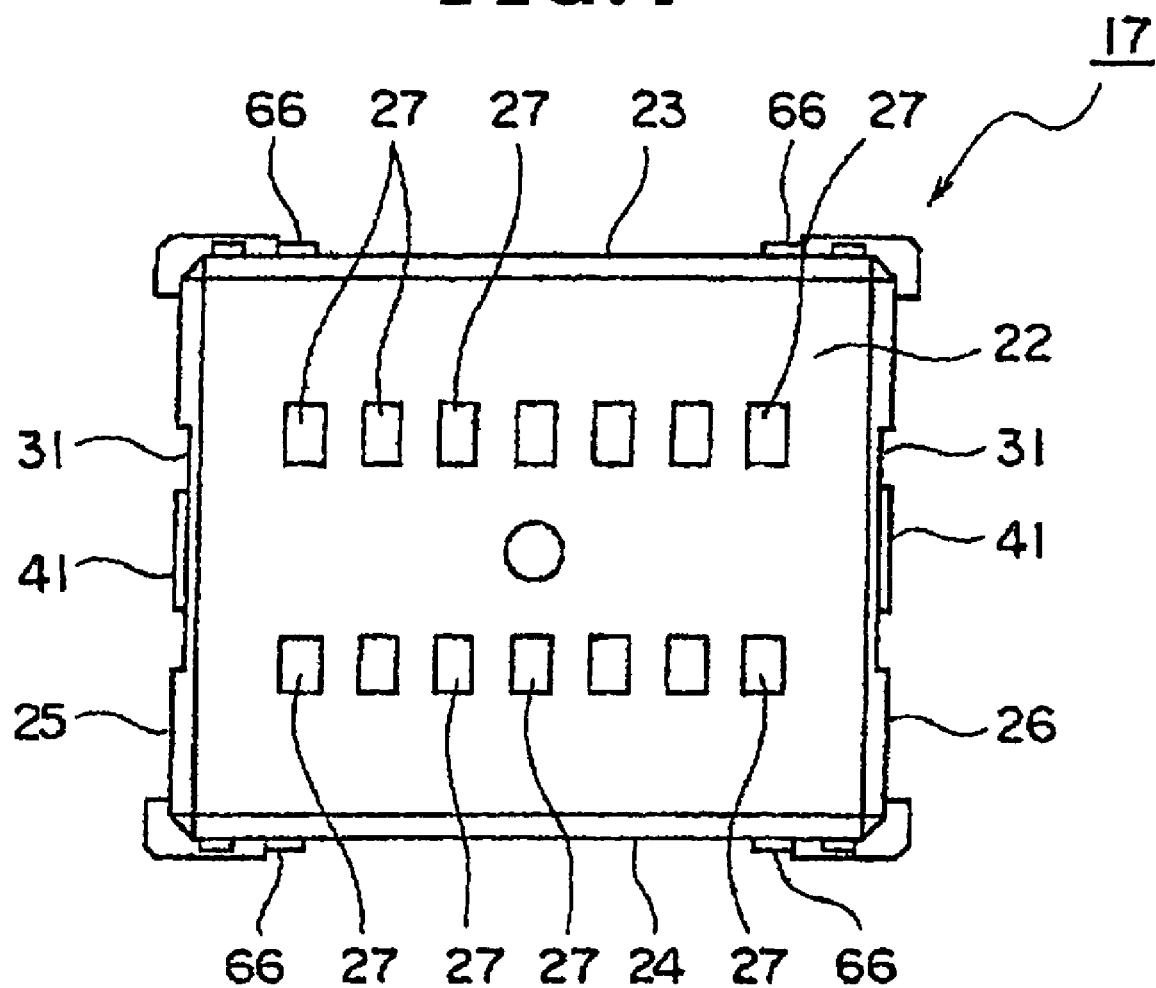
FIG. 7 shows a sectional view for illustrating the socket housing of FIG. 1.
Figure 8:
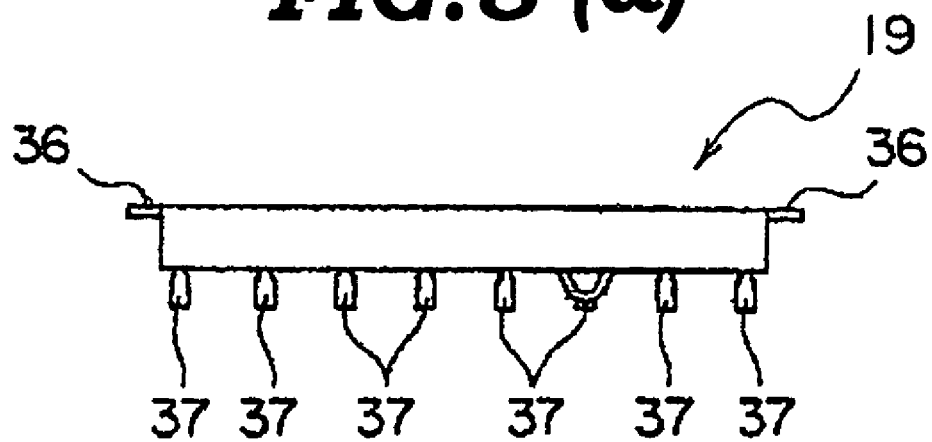
FIG. 8(a) shows a plane view for illustrating a front surface shielding member of FIG. 1.
FIG. 8(b) shows a front view for illustrating the front surface shielding member of FIG. 1.
FIG. 8(c) shows a side view for illustrating the front surface shielding member of FIG. 1.
Figure 8:
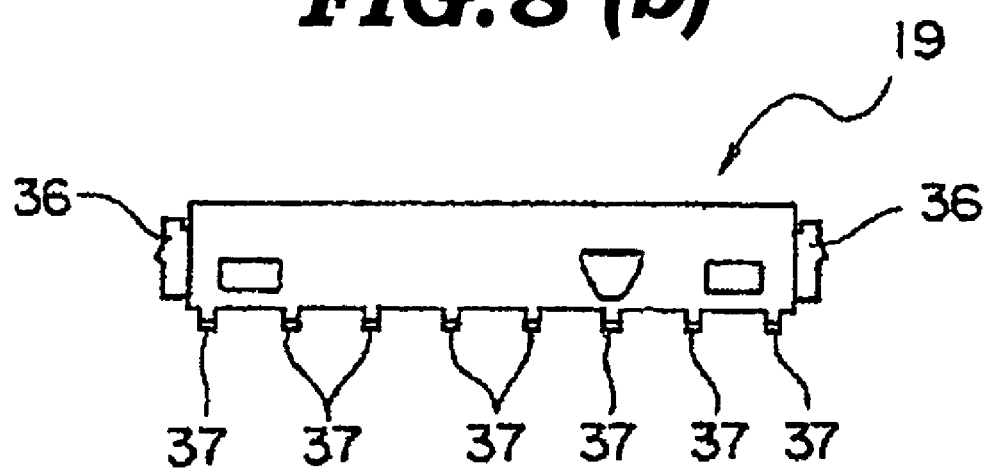
Figure 8:

As shown in FIG. 3, a socket inserting hole 13 is formed on a predetermined location of the printed circuit board 11. The socket inserting hole 13 penetrates from the front surface to the rear surface of the printed circuit board 11. Contact connecting patterns 14 and shield connecting patterns 15 are located in alternating sequence on a front edge portion and a rear edge portion of the socket inserting hole 13, respectively. In addition, shield connecting patterns 16 are formed on both of side edge portions of the socket inserting hole 13.

The electronic parts installing socket 10 comprises a socket housing 17 inserted into the socket inserting hole 13 and a plurality of contacts 18 held on the socket housing 17. In addition, the electronic parts installing socket 10 is shielded by front surface shielding members 19, shielding members 20 each of which are fixed, and a rear surface shielding member 21.

As shown in FIGS. 4 to 7, the socket housing 17 is composed of a plane shaped bottom plate 22 and a box shaped insulating member, such as a synthetic resin, having surrounding wall plates 23, 24, 25, and 26 which forms a surrounding wall.

Avoidance concave portions 27 are formed on the bottom plate 22 at a predetermined interval. Each of the avoidance concave portions 27 receives an elastic contact piece of the contact 18 and provides contact between contact 18 and bottom plate 22. A bottom portion of each avoidance concave portion 27 penetrates through the rear surface of the bottom plate 22.

The surrounding wall plates 23 and 24 arise from edge portions of the bottom plate 22 and are formed into plane shapes, respectively. A concave portion 28 is formed on an upper edge portion of each of the surrounding wall plates 23 and 24. The front surface shielding member 19 is fitted into the concave portion 28.

In addition, contact inserting concave portions 29 are formed on inner surfaces of the surrounding wall plates 23 and 24 and continue to the avoidance concave portions 27. Contact attachment grooves 30 are formed on both of the side edges of each contact inserting concave portion 29. A side portion of contact 18 is fitted into each of the contact attachment grooves 30.

Further, the surrounding wall plates 25 and 26 arise from edge portions of the bottom plate 22 and are formed into plane shapes, respectively. A fitting concave portion 31 is formed on an outer side surface of each of the surrounding wall plates 25 and 26. The shielding member 20 having the fixing portion is fitted into the fitting concave portion 31. Shield attachment grooves 32 are formed on both of side portions of each contact inserting concave portion 29. A side portion of the shielding member 20 having the fixing portion is fitted into each of the shield attachment grooves 30.

Fixing portion avoidance concave portions 33 are formed on the surrounding wall plate 25. Each of the fixing portion avoidance concave portion 33 is used to elastically deform an electronic parts fixing portion for holding the electronic parts 12 that will be described hereinafter. A positioning projection portion 12a of the electronic parts 12 fits into a positioning concave portion 34.

As shown in FIGS. 8(a) to 8(c), each of the front surface shielding members 19 is made of a conductive plate material is composed of a copper alloy with tin plating. The conductive plate material is bent into a U-shape in a sectional view, in order to form the front surface shielding member 19. Fixing projection pieces 36 are integrally formed on both of inner side portions of the front surface shielding member 19. The fixing projection pieces 36 are fitted into the attachment grooves 35 which are formed on the inner edges of the surrounding wall plates 23 and 24, respectively. A plurality of shielding pieces 37 are integrally formed on the outer lower edge portions of the front surface shielding member 19 organized in an alternating pattern. The shielding pieces 37 extend outward.

When the fixing projection pieces 36 are fitted into the attachment grooves 35, respectively, and the side edge portion of concave portion 28 are sandwiched by both of side portions of front surface shielding member 20, the front surface shielding member 20 is fixed to the surrounding wall plates 23 and 24.

Figure 9:
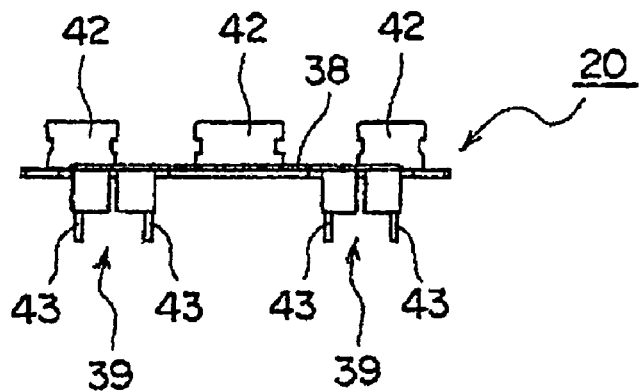
FIG. 9(a) shows a plane view for illustrating a shielding member having a fixing portion of FIG. 1.
FIG. 9(b) shows a front view for illustrating the shielding member having the fixing portion of FIG. 1.
FIG. 9(c) shows a side view for illustrating the shielding member having the fixing portion of FIG. 1.
Figure 9:
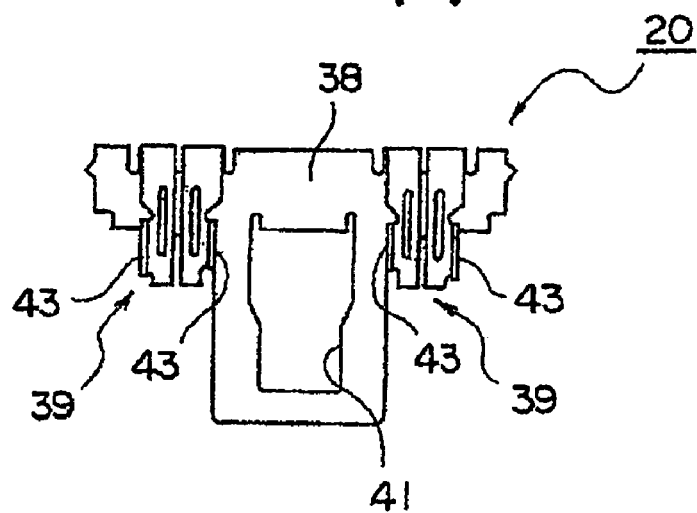
Figure 9:
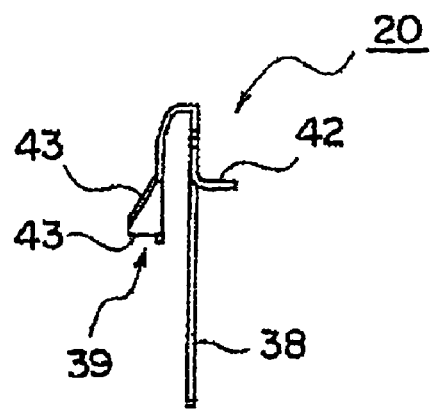

As shown in FIG. 9, the shielding member 20 having a fixing portion includes an outer plate 38 having an approximate T-shape and electronic parts fixing portions 39 which are integrally formed on an upper edge of the outer plate 38 by bending outer plate 38. The shielding member 20 having the fixing portion is made of a conductive plate material which is composed of a copper alloy provided with a tin plating. The conductive plate material is stamped into a predetermined shape and subjected to a bending process to form the shielding member 20 having the fixing portion.

A stopping hole 41 is formed on an central area of the outer plate 38. A fitting projection 40, which projects from the bottom surface of the fitting concave portion 31, is fitted into the stopping hole 41. Shielding connection pieces 42, which are bent to connect to the printed circuit board 11, are integrally formed on the upper edge of the stopping hole 41 and the lower edges of projection pieces of the T-shape.

Each of the electronic parts fixing portions 39 has a bifurcated shape and is bent in an inward direction. Each of the electronic parts fixing portions 39 is elastically deformed at a bent portion which is its static position.

Stopping projections 43 are formed on the outer edge of the electronic parts fixing portion 39 and are bent outward. Stopping projections 43 are fitted to the upper edge portion of the electronic parts.

Figure 10:
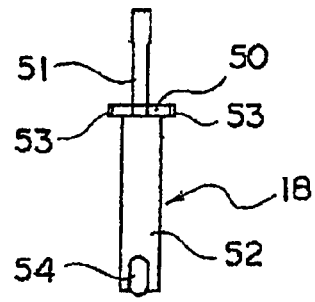
FIG. 10(a) shows a plane view for illustrating a contact of FIG. 1.
FIG. 10(b) shows a front view for illustrating the contact of FIG. 1.
FIG. 10(c) shows a bottom view for illustrating the contact of FIG. 1.
FIG. 10(d) shows a side view for illustrating the contact of FIG. 1.
Figure 10:
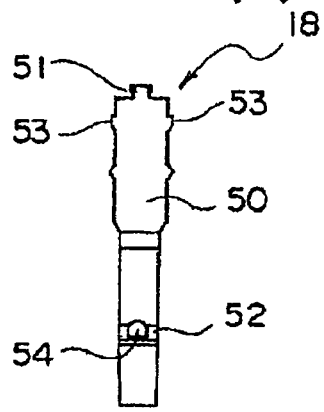
Figure 10:
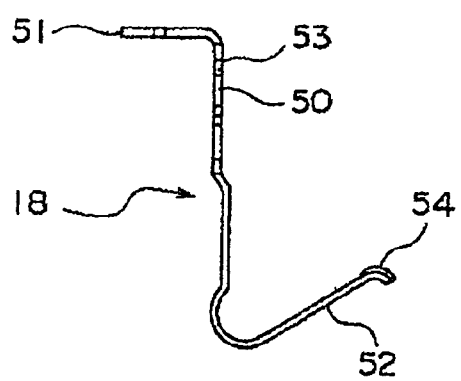
Figure 10:
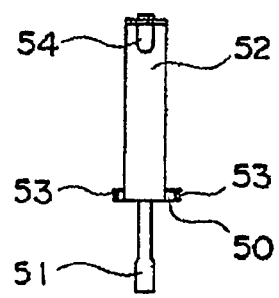
Figure 11:
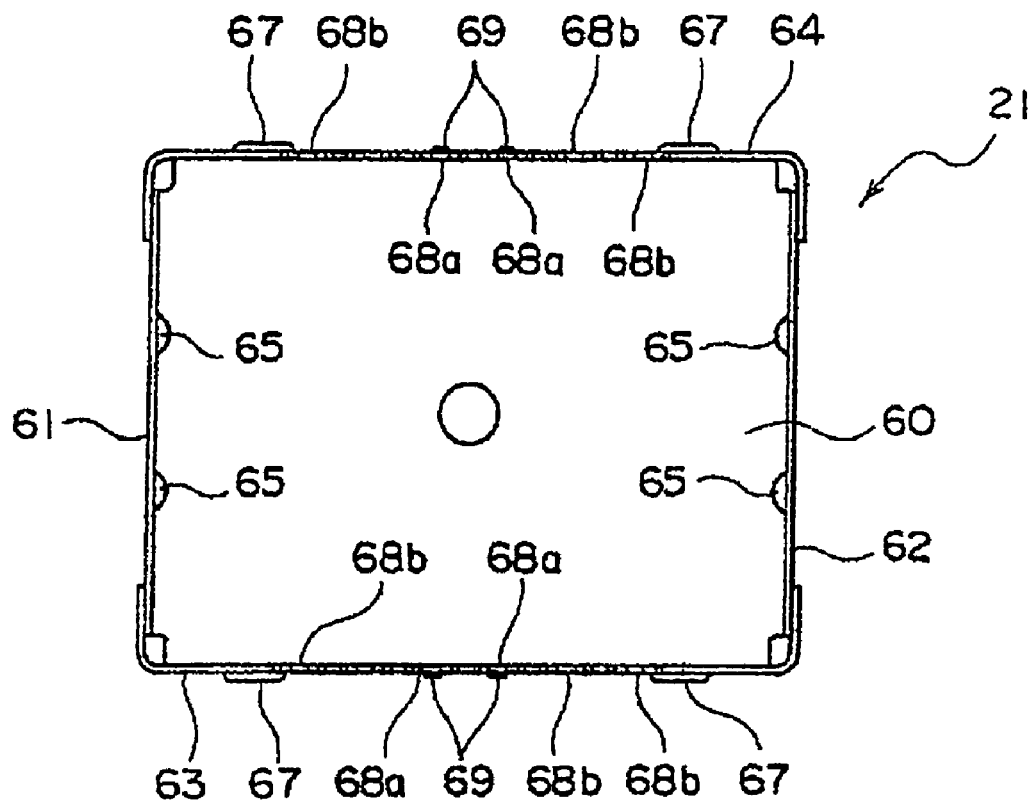
FIG. 11 shows a plane view for illustrating a rear surface shielding member of FIG. 1.
Figure 12:
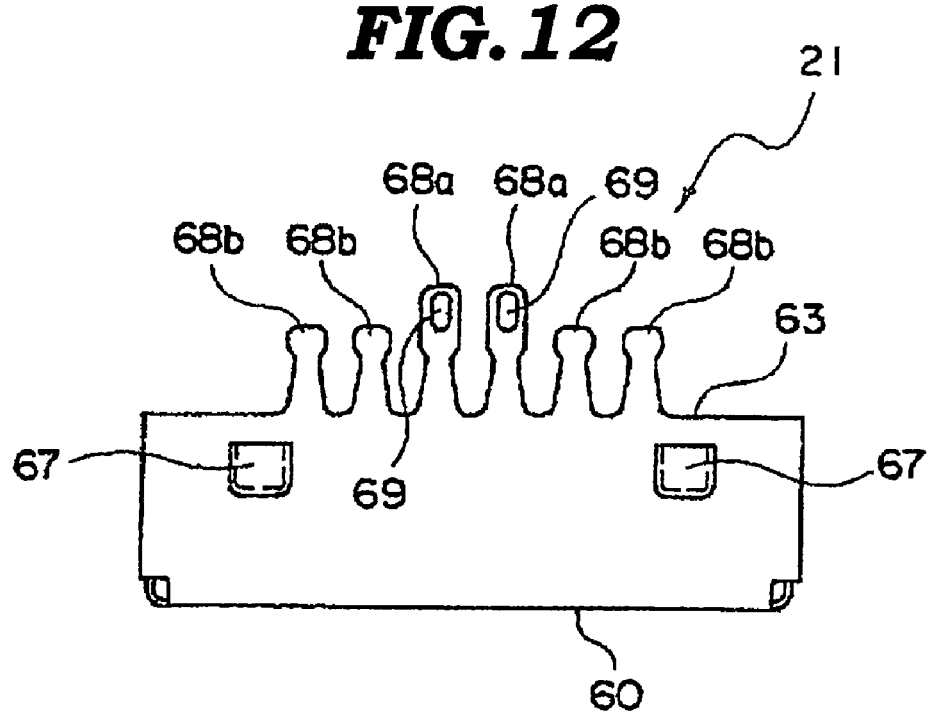
FIG. 12 shows a front view for illustrating the rear surface shielding member of FIG. 1.
Figure 13:
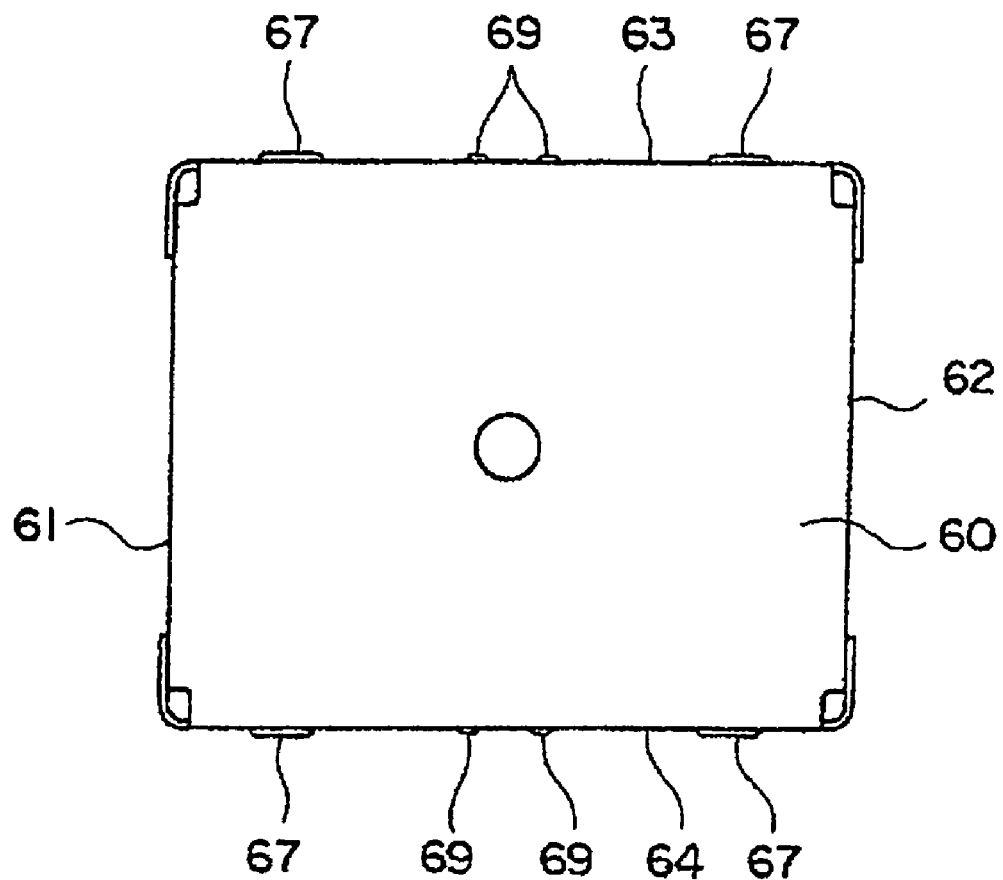
FIG. 13 shows a bottom view for illustrating the rear surface shielding member of FIG. 1.
Figure 14:
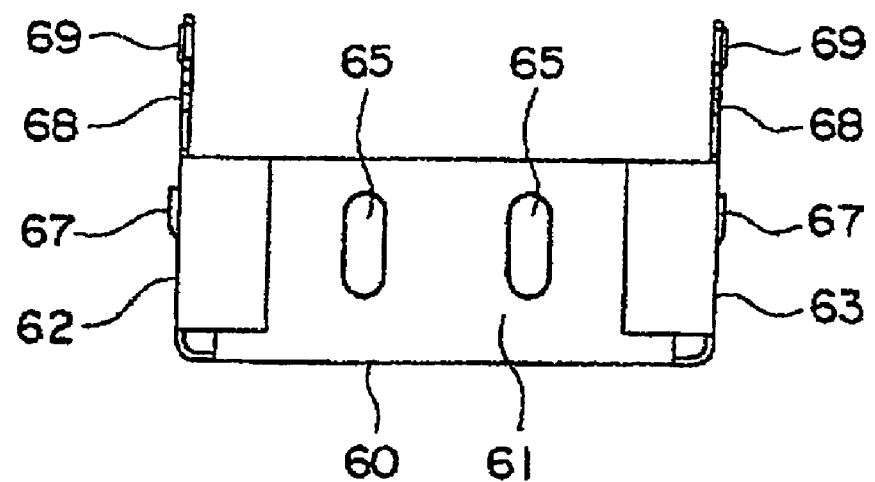
FIG. 14 shows a side view for illustrating the rear surface shielding member of FIG. 1.

As shown in FIG. 10, the contact 18 comprises a fixing piece 50 having a plane shape, a contact piece 51 projecting outward from the upper edge of the fixing piece 50, an elastic contact piece 52 angled from the lower edge of fixing piece 50. In order to form the contact 18, a conductive material is stamped into a predetermined shape and subjected to a bending process.

The fixing piece 50 has a width which is greater than the width of the contact inserting concave portion 29. Stopping projections 53 are integrally formed on both of side edges of the fixing piece 50.

Both side portions of the fixing piece 50 are fitted into the contact attachment grooves 30 and the stopping projections 53 are engaged in the contact attachment grooves 30. As a result, the contact 18 is fixed to the socket housing 17.

The contact piece 51 has a width which is less than the width of the fixing piece 50. The contact piece 51 projects from lower edge of the concave portion 28 to the outside of the socket housing 17.

The elastic contact piece 52 has a contact portion 52 which is circularly bent and is positioned at a top of the elastic contact piece 52. The elastic contact piece 52 elastically deforms at a boundary between the fixing piece 50 and the elastic contact piece 52 in the static position. Accordingly, the contact portion 54 is elastically contact with the terminal piece of the electronic parts 12.

The contact 18 is inserted from an upper side of the socket housing 17 to the contact inserting concave portion 29 and the both side portions of the fixing piece 50 is fitted into the contact attachment grooves 30, in order to fix the contact 18. The elastic contact piece 52 projects in the socket housing 17. A plurality of contact pieces 51 are arranged so each projects outward from a gap between the shielding pieces 37.

As shown in FIGS. 11 to 14, the rear surface shielding member 21 comprises a bottom plate 60 of a plane shape and side wall plates 61, 62, 63, and 64 which arise from four sides of the bottom plate 60, respectively. In order to form the rear surface shielding member 21, a conductive plate material composed of a copper alloy with tin plating is stamped into a predetermined shape and is bent into a box shape having an opening which is positioned at an upper surface of the rear surface shielding member 21.

Each of the side wall plates 61 and 62 is formed into a plane shape and continues to the bottom plate 60. Contact portions 65, which are recessed inward, are formed at the central areas of the side wall plates 61 and 62, respectively.

Each of the side wall plates 63 and 64 is formed into a plane shape and continues to the bottom plate 60. Stopping concave portions 67 are formed on the side wall plates 63 and 64, respectively. Stopping projections 66, which are formed on the outer surfaces of the socket housing side walls 23 and 24, are fitted into the stopping concave portions 67, respectively.

In addition, a plurality of connecting pieces 68 are integrally formed on the upper edges of the side wall plates 63 and 64 and are arranged similar to the teeth of a comb (e.g., in a row).

The connecting pieces 68 are arranged at a predetermined interval which is suited to a distance between the contact pieces 51 of the contacts 18. Each contact piece 51 of the contact 18 projects outward from a gap between the connecting pieces 68.

Each of the connecting pieces 68a positioned at a central location has a length which is greater than the length of each of the other connecting pieces 68b. A contact portion 69 contacts the inner surface of the front surface shielding member 19, and is formed on the tip of the connecting piece 68a.

Furthermore, both side portions of the side wall plates 63 and 64 are extended so as to form extension portions. The extension portions are bent so as to overlap the side portions of the side wall plates 61 and 62.

In the above-mentioned electronic parts installing socket 10, the lower portion of the socket housing 17 is inserted into the socket inserting hole 13 when the rear surface shielding member 21 is not attached. The contact piece 51 of the contact 18, the shielding piece 37, and shield connecting piece 42 are in contact with the opening edge of the socket inserting hole 13, that is, the contact piece 51 of the contact 18, the shielding piece 37, and shield connecting piece 42 contact the contact connecting patterns 14, the shield connecting patterns 15, and the shield connecting patterns 16, respectively and are prevented from dropouts.

By reflow soldering, the contact piece 51 of the contact 18, the shielding piece 37, and shield connecting piece 42 are fixed to the contact connecting patterns 14, the shield connecting patterns 15, and the shield connecting patterns 16, respectively. The electronic parts installing socket 10 is physically and electronically connected to the printed circuit board.

From the rear surface of the printed circuit board 11, a portion of the socket housing 17, which projects to the rear surface of the printed circuit board 11, is covered with the rear surface shielding member 21. As a result, the stopping projections 66, which is formed on the outer surfaces of the socket housing surrounding wall plates 23 and 24, are fitted into the stopping concave portions 67 of the rear surface shielding member 21. The rear surface shielding member 21 is fixed to the socket housing 17.

Further, the connecting pieces 68 are inserted into the inner edge portions of the front surface shielding member 19 and the contact portions 69 contact the inner side surface of the front surface shielding member 19. The contact portions 65 of the rear surface shielding member 21 contact the outer side plate 38 of the shielding member 20 having the fixing portion. The shielding member 20 having the fixing portion is connected to the rear surface shielding member 21.

In addition, it is possible to obtain a sufficient shielding effect for the contact piece 51, inasmuch as the contact piece 51 of the contact 18 is positioned between the shielding pieces 37.

Electronic parts 12 may be, for example, a high frequency electronic parts such as the above-mentioned camera module which generates a high frequency, a semiconductor element, or a electronic parts such as an IC unit.

What is claimed is:

1. An electronic parts installing socket comprising:
   a socket housing fitting into a socket inserting hole penetrating through a front surface and a rear surface of a printed circuit board;
   a plurality of contacts each having contact pieces engaging said socket housing and projecting from a side surface of said socket housing, said contact pieces connecting in a contact connecting pattern positioned at an opening edge portion of said socket inserting hole;
   a front surface shielding member shielding a front surface of said socket housing, said front surface shielding member having a plurality of shielding pieces positioned in a row so as to contain said contact pieces of said contacts and which are connected to a shield connecting pattern formed on the opening edge portion of said socket inserting hole; and
   an electronic part held on said socket housing and connected to said printed circuit board through said contacts,
   wherein the contact connecting pattern and shield connecting pattern are arranged to form an alternating sequence of contact pieces and shielding pieces along the opening edge portion.

2. An electronic parts installing socket as claimed in claim 1, further comprising: a rear surface shielding member formed in a box shape covering a portion projecting from the rear surface of said printed circuit board to said socket housing, said rear surface shielding member having a plurality of connecting pieces arranged in a row on an upper edge of said rear surface shielding member; said rear surface shielding member attached to a rear surface portion of said socket housing; and said connecting pieces connected to said front surface shielding member through said socket inserting hole and the contact pieces of said contacts projecting outward from gaps between said connecting pieces.

* * * * *